US011805647B2

(12) United States Patent
Zhu

(10) Patent No.: US 11,805,647 B2
(45) Date of Patent: Oct. 31, 2023

(54) THREE-DIMENSIONAL MEMORY DEVICE HAVING EPITAXIALLY-GROWN SEMICONDUCTOR CHANNEL AND METHOD FOR FORMING THE SAME

(71) Applicant: YANGTZE MEMORY TECHNOLOGIES CO., LTD., Wuhan (CN)

(72) Inventor: Hongbin Zhu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 452 days.

(21) Appl. No.: 17/167,003

(22) Filed: Feb. 3, 2021

(65) Prior Publication Data

US 2021/0159247 A1 May 27, 2021

Related U.S. Application Data

(60) Division of application No. 16/727,883, filed on Dec. 26, 2019, now Pat. No. 11,581,328, which is a
(Continued)

(51) Int. Cl.
*H10B 43/27* (2023.01)
*H10B 43/35* (2023.01)

(52) U.S. Cl.
CPC ............ *H10B 43/27* (2023.02); *H10B 43/35* (2023.02)

(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS 6,093,652 A 7/2000 Pan et al.
9,728,551 B1 * 8/2017 Lu ..................... H01L 21/3003
(Continued)

FOREIGN PATENT DOCUMENTS

CN 107564915 A 1/2018
CN 109314118 A 2/2019
(Continued)

OTHER PUBLICATIONS

International Search Report issued in corresponding International Application No. PCT/CN2019/108922, dated Jun. 28, 2020, 4 pages.
(Continued)

*Primary Examiner* — Didarul A Mazumder
*Assistant Examiner* — Gustavo G Ramallo
(74) *Attorney, Agent, or Firm* — BAYES PLLC

(57) ABSTRACT

Embodiments of 3D memory devices and methods for forming the same are disclosed. In an example, a method for forming a 3D memory device is disclosed. A channel opening extending vertically is formed above a substrate. A semiconductor plug is formed in a lower portion of the channel opening. A memory film and a channel sacrificial layer are subsequently formed above the semiconductor plug and along a sidewall of the channel opening. A semiconductor plug protrusion protruding above the semiconductor plug and through a bottom of the memory film and the channel sacrificial layer is formed. A cap layer is formed in the channel opening and over the channel sacrificial layer. The cap layer covers the semiconductor plug protrusion. A semiconductor channel is formed between the memory film and the cap layer by replacing the channel sacrificial layer with a semiconductor material epitaxially grown from the semiconductor plug protrusion.

11 Claims, 11 Drawing Sheets

Related U.S. Application Data continuation of application No. PCT/CN2019/108922, filed on Sep. 29, 2019.

(58) Field of Classification Search
CPC ........ H10B 53/50; H10B 41/00; H10B 41/10; H10B 41/20; H10B 41/23; H10B 41/27; H10B 41/30; H10B 41/35; H10B 41/40–44; H10B 413/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50; H01L 29/7926; H01L 21/76897

See application file for complete search history.

(56) References Cited

U.S. PATENT DOCUMENTS

| | | | |
|---|---|---|---|
| 10,177,160 B2 | 1/2019 | Pyon et al. | |
| 10,868,030 B2* | 12/2020 | Shioda | H10B 43/27 |
| 2015/0060998 A1* | 3/2015 | Mizushima | H01L 29/66833 |
| | | | 438/270 |
| 2015/0380418 A1 | 12/2015 | Zhang et al. | |
| 2016/0104719 A1 | 4/2016 | Jung et al. | |
| 2016/0276365 A1 | 9/2016 | Choi et al. | |
| 2017/0025428 A1 | 1/2017 | Lai et al. | |
| 2017/0125437 A1 | 5/2017 | Pachamuthu et al. | |
| 2017/0250193 A1* | 8/2017 | Huo | H10B 43/27 |
| 2018/0366489 A1 | 12/2018 | Harari et al. | |
| 2019/0081069 A1 | 3/2019 | Lu et al. | |
| 2020/0020713 A1* | 1/2020 | Choi | H10B 43/35 |
| 2020/0105781 A1* | 4/2020 | Yang | G11C 16/0483 |
| 2020/0126974 A1* | 4/2020 | Liu | G11C 16/0483 |
| 2021/0098489 A1* | 4/2021 | Zhu | H10B 43/35 |
| 2022/0285386 A1* | 9/2022 | Said | H10B 43/27 |

FOREIGN PATENT DOCUMENTS

| | | |
|---|---|---|
| CN | 109417074 A | 3/2019 |
| CN | 109524410 A | 3/2019 |
| CN | 110114879 A | 8/2019 |
| CN | 110114880 A | 8/2019 |
| EP | 3503185 A1 | 6/2019 |
| JP | 2013229468 A | 11/2013 |
| TW | I505446 B | 10/2015 |
| TW | I665763 B | 7/2019 |

OTHER PUBLICATIONS

Written Opinion of the International Searching Authority issued in corresponding International Application No. PCT/CN2019/108922, dated Jun. 28, 2020, 5 pages.

* cited by examiner

THREE-DIMENSIONAL MEMORY DEVICE HAVING EPITAXIALLY-GROWN SEMICONDUCTOR CHANNEL AND METHOD FOR FORMING THE SAME

CROSS-REFERENCE TO RELATED APPLICATIONS

This application is a divisional of U.S. application Ser. No. 16/727,883, filed on Dec. 26, 2019, entitled "THREE-DIMENSIONAL MEMORY DEVICE HAVING EPITAXIALLY-GROWN SEMICONDUCTOR CHANNEL AND METHOD FOR FORMING THE SAME," which is a continuation of International Application No. PCT/CN2019/108922, filed on Sep. 29, 2019, entitled "THREE-DIMENSIONAL MEMORY DEVICE HAVING EPITAXIALLY-GROWN SEMICONDUCTOR CHANNEL AND METHOD FOR FORMING THE SAME," both of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a substrate, a memory stack including interleaved conductive layers and dielectric layers above the substrate, and a memory string extending vertically through the memory stack. The memory string includes a single crystalline silicon plug in a lower portion of the memory string, a memory film above the single crystalline silicon plug and along a sidewall of the memory string, and a single crystalline silicon channel over the memory film and along the sidewall of the memory string.

In another example, a 3D memory device includes a substrate, a memory stack including interleaved conductive layers and dielectric layers above the substrate, and a memory string extending vertically through the memory stack. The memory string includes a semiconductor plug in a lower portion of the memory string, a memory film above the semiconductor plug and along a sidewall of the memory string, a semiconductor channel over the memory film and along the sidewall of the memory string, and a semiconductor plug protrusion protruding above the semiconductor plug and through a bottom of the memory film and the semiconductor channel.

In still another example, a method for forming a 3D memory device is disclosed. A channel opening extending vertically is formed above a substrate. A semiconductor plug is formed in a lower portion of the channel opening. A memory film and a channel sacrificial layer are subsequently formed above the semiconductor plug and along a sidewall of the channel opening. A semiconductor plug protrusion protruding above the semiconductor plug and through a bottom of the memory film and the channel sacrificial layer is formed. A cap layer is formed in the channel opening and over the channel sacrificial layer. The cap layer covers the semiconductor plug protrusion. A semiconductor channel is formed between the memory film and the cap layer by replacing the channel sacrificial layer with a semiconductor material epitaxially grown from the semiconductor plug protrusion.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
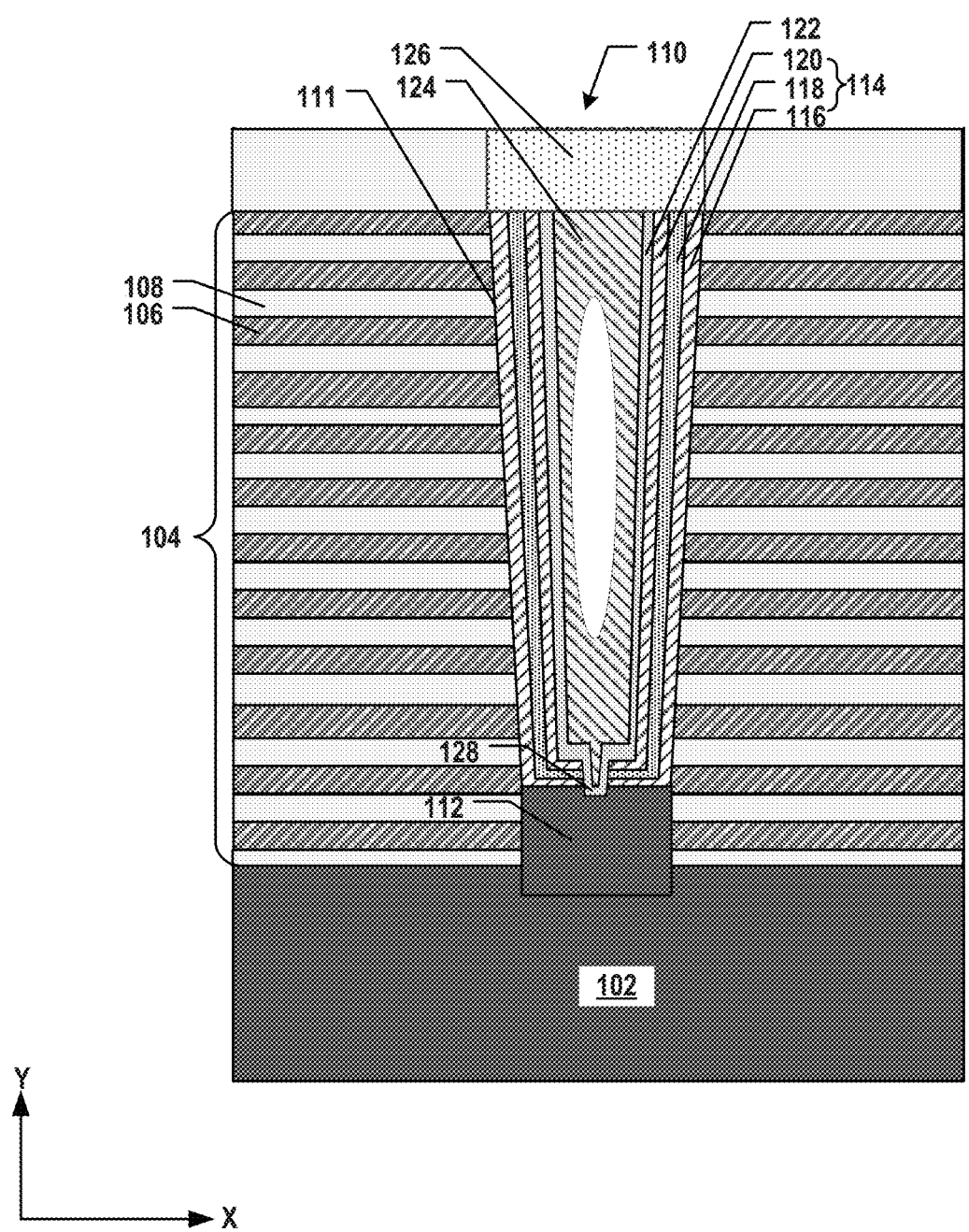
FIG. 1 illustrates a cross-section of a 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

One way to fabricate 3D NAND memory devices is to form the channel after the memory stack formation, hence adopting polysilicon as channel material. However, polycrystalline materials are rich in defects and grain boundaries that fundamentally limit the current conduction in the channel. As a result, the channel drive current ($I_{ON}$) becomes low, and further reduces with 3D stacking of memory cells, thus rendering the long-term scaling of 3D NAND memory devices, with a polysilicon channel, unsustainable.

For example, FIG. 1 illustrates a cross-section of a 3D memory device 100. 3D memory device 100 includes a memory stack 104, which includes a plurality of pairs each including a conductive layer 106 and a dielectric layer 108, formed above a substrate 102. A NAND memory string 110 of 3D memory device 100 extends vertically through memory stack 104. As shown in FIG. 1, NAND memory string 110 includes a channel structure 111 and two plugs—a semiconductor plug 112 and a channel plug 126—in the lower portion and upper portion of NAND memory string 110, respectively. Channel structure 111 includes a memory film 114, a semiconductor channel 122, and a cap layer 124 arranged radially toward the center of channel structure 111. Memory film 114 is a composite dielectric layer including a blocking layer 116, a storage layer 118, and tunneling layer 120 arranged radially toward the center of channel structure 111.

Semiconductor channel 122, along the sidewall of memory string 110, is formed of a layer of polysilicon deposited over tunneling layer 120 of memory film 114 and is electrically connected to semiconductor plug 112 by a semiconductor contact 128 extending vertically through the bottom of memory film 114. Semiconductor contact 128 also includes polysilicon deposited into an opening through the bottom of memory film 114 to semiconductor plug 112. As described above, the characteristics of polysilicon limits the current conduction in semiconductor channel 122, thereby affecting the performance of 3D memory device 100.

Various embodiments in accordance with the present disclosure provide an epitaxially-grown semiconductor channel and fabrication method thereof for improving the electrical performance of a 3D memory device. The semiconductor channel of the 3D memory device can be formed of single crystalline material(s) selectively and epitaxially grown over the memory film along the sidewall of the memory string. In some embodiments, the substrate is a silicon substrate, and the epitaxially-grown semiconductor channel includes single crystalline silicon, which has superior electrical characteristics compared with polysilicon, e.g., with higher mobility. In some embodiments, the 3D memory device disclosed herein further includes a semiconductor plug protrusion protruding above the semiconductor plug, which is epitaxially grown from the substrate, and through the bottom of the memory film and the epitaxially-grown channel. The semiconductor plug protrusion can be selectively and epitaxially grown from the epitaxially-grown semiconductor plug, for example, including single crystalline silicon, and act as the source from which the semiconductor channel can be selectively and epitaxially grown. Moreover, during the fabrication process, the semiconductor plug protrusion can support the sidewall opening into which the semiconductor channel is epitaxially grown at the stage between the formation of the sidewall opening and the formation of the semiconductor channel, thereby increasing the production yield.

Figure 2:
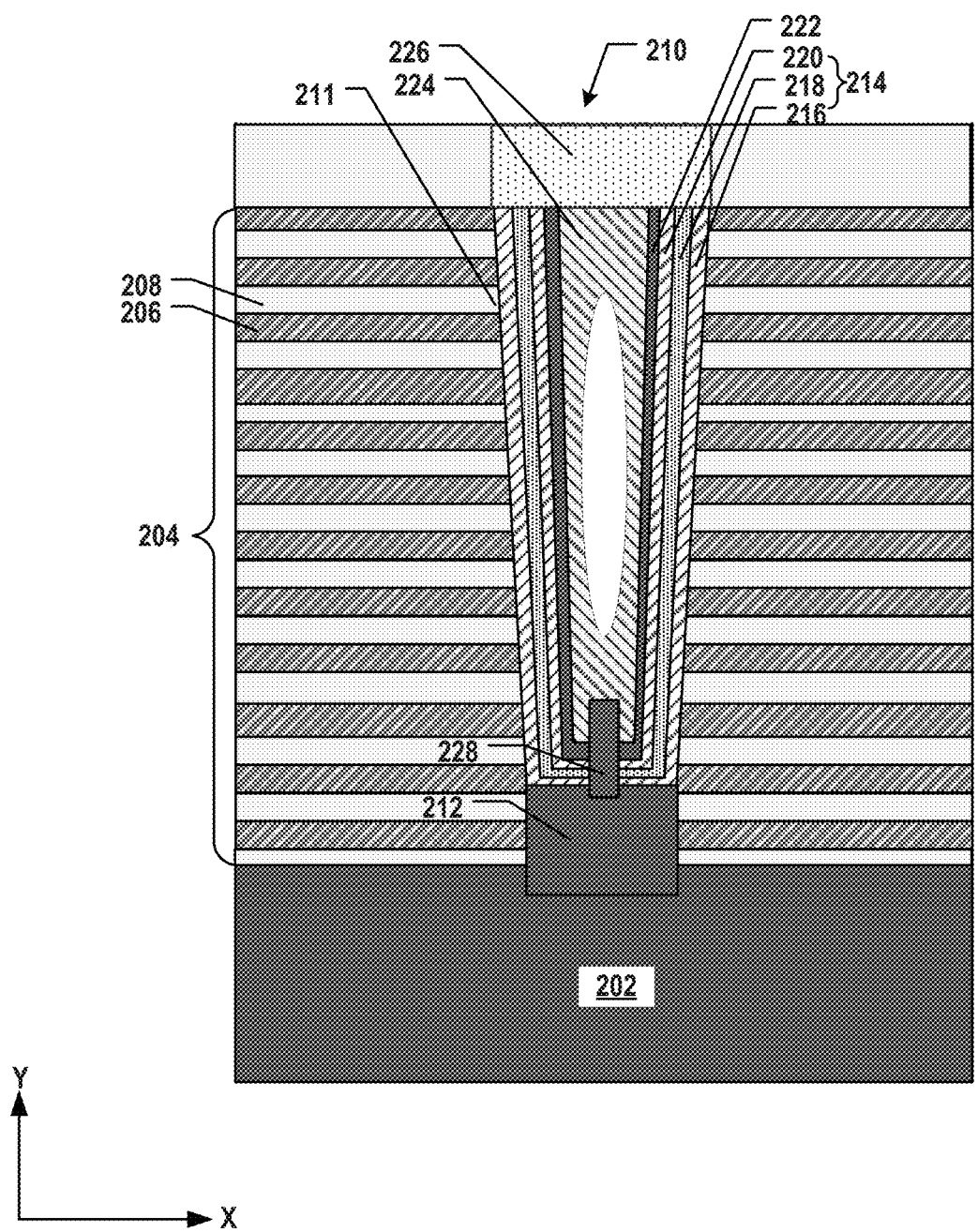
FIG. 2 illustrates a cross-section of an exemplary 3D memory device having an epitaxially-grown semiconductor channel, according to some embodiments of the present disclosure.

FIG. 2 illustrates a cross-section of an exemplary 3D memory device 200 having an epitaxially-grown semiconductor channel, according to some embodiments of the present disclosure. 3D memory device 200 can include a substrate 202, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 202 is a thinned substrate (e.g., a semiconductor layer), which was thinned by grinding, etching, chemical mechanical polishing (CMP), or any combination thereof. It is noted that x- and y-axes are included in FIG. 2 to further illustrate the spatial relationship of the components in 3D memory device 200. Substrate 202 of 3D memory device 200 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 200) is determined relative to the substrate of the 3D memory device (e.g., substrate 202) in the y-direction (i.e., the vertical direction) when the substrate is positioned in the lowest plane of the 3D memory device in the y-direction. The same notion for describing the spatial relationship is applied throughout the present disclosure.

3D memory device 200 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 200 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 202) remains as the substrate of the bonded non-monolithic 3D memory device, and the peripheral device (e.g., including any suitable digital, analog, and/or mixed-signal peripheral circuits used for facilitating the operation of 3D memory device 200, such as page buffers, decoders, and latches; not shown) is flipped and faces down toward the memory array device (e.g., NAND memory strings) for hybrid bonding. It is understood that in some embodiments, the memory array device substrate (e.g., substrate 202) is flipped and faces down toward the peripheral device (not shown) for hybrid bonding, so that in the bonded non-monolithic 3D memory device, the memory array device is above the peripheral device. The memory array device substrate (e.g., substrate 202) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 200 is a NAND flash memory device in which memory cells are provided in the form of an array of NAND memory strings 210 extending vertically above substrate 202. The memory array device can include NAND memory strings 210 that extend through a plurality of pairs each including a conductive layer 206 and a dielectric layer 208 (referred to herein as "conductive/dielectric layer pairs"). The stacked conductor/dielectric layer pairs are also referred to herein as a "memory stack" 204. In some embodiments, a pad layer (not shown), such as a silicon oxide layer, is formed between substrate 202 and memory stack 204. The number of the conductive/dielectric layer pairs in memory stack 204 (e.g., 32, 64, 96, 128, 192, or 256) determines the number of memory cells in 3D memory device 200. Memory stack 204 can include a plurality of interleaved conductive layers 206 and dielectric layers 208. Conductive layers 206 and dielectric layers 208 in memory stack 204 can alternate in the vertical direction. Conductive layers 206 can include conductive materials including, but not limited to, tungsten (W), cobalt (Co), copper (Cu), aluminum (Al), polysilicon, doped silicon, silicides, or any combination thereof. Dielectric layers 208 can include dielectric materials including, but not limited to, silicon oxide, silicon nitride, silicon oxynitride, or any combination thereof. Although not shown, it is understood that in some embodiments, memory stack 204 has a multiple-deck architecture, which includes a plurality of memory decks stacked over one another, to increase the number of the conductor/dielectric layer pairs.

As shown in FIG. 2, NAND memory string 210 can include a semiconductor plug 212 in the lower portion (e.g., at the lower end) of NAND memory string 210. As used herein, the "upper end" of a component (e.g., NAND memory string 210) is the end farther away from substrate 202 in the y-direction, and the "lower end" of the component (e.g., NAND memory string 210) is the end closer to substrate 202 in the y-direction when substrate 202 is positioned in the lowest plane of 3D memory device 200. Semiconductor plug 212 can include a single crystalline semiconductor material (also known as "monocrystalline semiconductor material"), such as single crystalline silicon, which can be epitaxially grown from substrate 202 in any suitable directions. In a single crystalline material, the crystal lattice of the entire sample can be continuous and unbroken to the edges of the sample, with no grain boundaries. In some embodiments, semiconductor plug 212 includes single crystalline silicon, the same material of substrate 202. In other words, semiconductor plug 212 can include an epitaxially-grown semiconductor layer that is the same as the material of substrate 202. For example, substrate 202 may be a silicon substrate, and semiconductor plug 212 may be a single crystalline silicon plug. Semiconductor plug 212 can function as a channel controlled by a source select gate of NAND memory string 210.

As shown in FIG. 2, NAND memory string 210 can also include a channel structure 211 above semiconductor plug 212 and extending vertically through memory stack 204. Channel structure 211 can include a channel hole filled with semiconductor material(s) (e.g., as a semiconductor channel 222) and dielectric material(s) (e.g., as a memory film 214). In some embodiments, memory film 214 is a composite layer above semiconductor plug 212 and along the sidewall of channel structure 211 of NAND memory string 210. In some embodiments, the bottom of memory film 214 further extends laterally over the top surface of semiconductor plug 212. Memory film 214 can include a tunneling layer 220, a storage layer 218 (also known as a "charge trap layer"), and a blocking layer 216. Tunneling layer 220 can include silicon oxide, silicon oxynitride, or any combination thereof. Storage layer 218 can include silicon nitride, silicon oxynitride, silicon, or any combination thereof. Blocking layer 216 can include silicon oxide, silicon oxynitride, high dielectric constant (high-k) dielectrics, or any combination thereof. In one example, memory film 214 can include a composite dielectric layer of silicon oxide/silicon oxynitride/silicon oxide (ONO).

In some embodiments, semiconductor channel 222 is above semiconductor plug 212 and over tunneling layer 220 of memory film 214. Semiconductor channel 222 can be formed along the sidewall of channel structure 211 of NAND memory string 210. In some embodiments, the bottom of semiconductor channel 222 further extends laterally over the bottom of tunneling layer 220 of memory film 214. In some embodiments, semiconductor channel 222 includes a single crystalline semiconductor material, such as single crystalline silicon. In some embodiments, the single crystalline material of semiconductor channel 222 is the same as the material of substrate 202. For example, substrate 202 may be a silicon substrate, and semiconductor channel 222 may be a single crystalline silicon channel, which has superior electrical characteristics, such as higher mobility and the resulting higher channel drive current ($I_{ON}$), compared with polysilicon semiconductor channels (e.g., 122 in FIG. 1).

The remaining space of channel structure 211 can be partially or fully filled with a cap layer 224 (with or without an air gap therein) including dielectric materials, such as silicon oxide. In some embodiments, cap layer 224 is formed over semiconductor channel 222. Channel structure 211 can have a cylinder shape (e.g., a pillar shape). Cap layer 224, semiconductor channel 222, tunneling layer 220, storage layer 218, and blocking layer 216 of memory film 214 are arranged radially from the center toward the outer surface of the pillar in this order (i.e., radially away from the center of channel structure 211 of NAND memory string 210), according to some embodiments.

As shown in FIG. 2, NAND memory string 210 of 3D memory device 200 further includes a semiconductor plug protrusion 228, according to some embodiments. Semiconductor plug protrusion 228 can protrude above semiconductor plug 212 and through the bottom of memory film 214 and semiconductor channel 222. The upper end of semiconductor plug protrusion 228 is above the bottom of semiconductor channel 222, according to some embodiments. The lower end of semiconductor plug protrusion 228 can be on or below the top surface of semiconductor plug 212. That is, semiconductor plug protrusion 228 can be in contact with both semiconductor channel 222 and semiconductor plug 212, for example, to electrically connect semiconductor channel 222 and semiconductor plug 212. Cap layer 224 covers semiconductor plug protrusion 228, according to some embodiments. For example, the part of semiconductor plug protrusion 228 above the bottom of semiconductor channel 222 may be in contact with cap layer 224, as opposed to the air gap. Similarly, the part of semiconductor plug protrusion 228 below the bottom of semiconductor channel 222 may be in contact with memory film 214. As a result, semiconductor plug protrusion 228 can be mechanically connected to and hold memory film 214 and cap layer 224 in the absence of semiconductor channel 222, for example, during the fabrication process. As described below in detail, semiconductor plug protrusion 228 can support the sidewall opening into which semiconductor channel 222 is formed prior to the formation of semiconductor channel 222.

In some embodiments, semiconductor plug protrusion 228 includes a single crystalline semiconductor material, such as single crystalline silicon. In some embodiments, the single crystalline material of semiconductor plug protrusion 228 is the same as the material of substrate 202. For example, substrate 202 may be a silicon substrate, and semiconductor plug protrusion 228 may be a single crystalline silicon plug protrusion. In some embodiments, semiconductor plug protrusion 228 is epitaxially grown from semiconductor plug 212, and semiconductor channel 222 is epitaxially grown from semiconductor plug protrusion 228. As a result, semiconductor plug 212, semiconductor channel 222, and semiconductor plug protrusion 228 can include the same semiconductor material, such as the same single crystalline semiconductor material epitaxially grown from substrate 202 originally. For example, substrate 202 may be a silicon substrate, semiconductor plug 212 may be a single crystalline silicon plug, semiconductor plug protrusion 228 may be a single crystalline silicon plug protrusion, and semiconductor channel 222 may be a single crystalline silicon channel. That is, semiconductor plug 212, semiconductor channel 222, and semiconductor plug protrusion 228 can form a continuous single crystalline silicon structure with less or no defects and grain boundaries compared with polysilicon.

In some embodiments, conductive layer 206 (each being part of a word line) in memory stack 204 functions as a gate conductor of memory cells in NAND memory string 210. Conductive layer 206 can include multiple control gates of multiple NAND memory cells and can extend laterally as a word line ending at the edges of memory stack 204 (e.g., in one or more staircase structures of memory stack 204). In some embodiments, memory cell transistors in NAND memory string 210 include gate conductors (i.e., parts of conductive layers 206 that abut channel structure 211) made from W, adhesion layers (not shown) including titanium/titanium nitride (Ti/TiN) or tantalum/tantalum nitride (Ta/TaN), gate dielectric layers (not shown) made from high-k dielectric materials, and channel structure 211 including single crystalline silicon.

In some embodiments, NAND memory string 210 further includes a channel plug 226 in the upper portion (e.g., at the upper end) of NAND memory string 210. Channel plug 226 can be above and in contact with the upper end of semiconductor channel 222. Channel plug 226 can include semiconductor materials (e.g., polysilicon). By covering the upper end of channel structure 211 during the fabrication of 3D memory device 200, channel plug 226 can function as an etch stop layer to prevent etching of dielectrics filled in channel structure 211, such as silicon oxide and silicon nitride. In some embodiments, channel plug 226 also functions as the drain of NAND memory string 210.

Although not shown in FIG. 2, it is understood that any other suitable components may be included as part of 3D memory device 200. For example, gate line slits, array common sources (ACSs), and local contacts, such as bit line contacts, word line contacts, and source line contacts, may be included in 3D memory device 100 for pad-out, i.e., electrically connecting NAND memory string 210 for metal routing to interconnects (e.g., middle-end-of-line (MEOL) interconnects and BEOL interconnects). In some embodiments, 3D memory device 200 further includes peripheral circuits, such as any suitable digital, analog, and/or mixed-signal peripheral circuits used for facilitating the operation of 3D memory device 200. For example, the peripheral circuits can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors).

FIGS. 3A-3H illustrate an exemplary fabrication process for forming a 3D memory device having an epitaxially-grown semiconductor channel, according to some embodiments of the present disclosure. FIG. 4 illustrates a flowchart of an exemplary method 400 for forming a 3D memory device having an epitaxially-grown semiconductor channel, according to some embodiments of the present disclosure. Examples of the 3D memory device depicted in FIGS. 3A-3H and 4 include 3D memory device 200 depicted in FIG. 2. FIGS. 3A-3H and 4 will be described together. It is understood that the operations shown in method 400 are not exhaustive and that other operations can be performed as well before, after, or between any of the illustrated operations. Further, some of the operations may be performed simultaneously, or in a different order than shown in FIG. 4.

Referring to FIG. 4, method 400 starts at operation 402, in which a channel opening extending vertically is formed above a substrate. The substrate can be a silicon substrate. In some embodiments, a dielectric stack including interleaved sacrificial layers and dielectric layers is formed above the substrate, and the channel opening is formed through the dielectric stack.

Figure 3A:
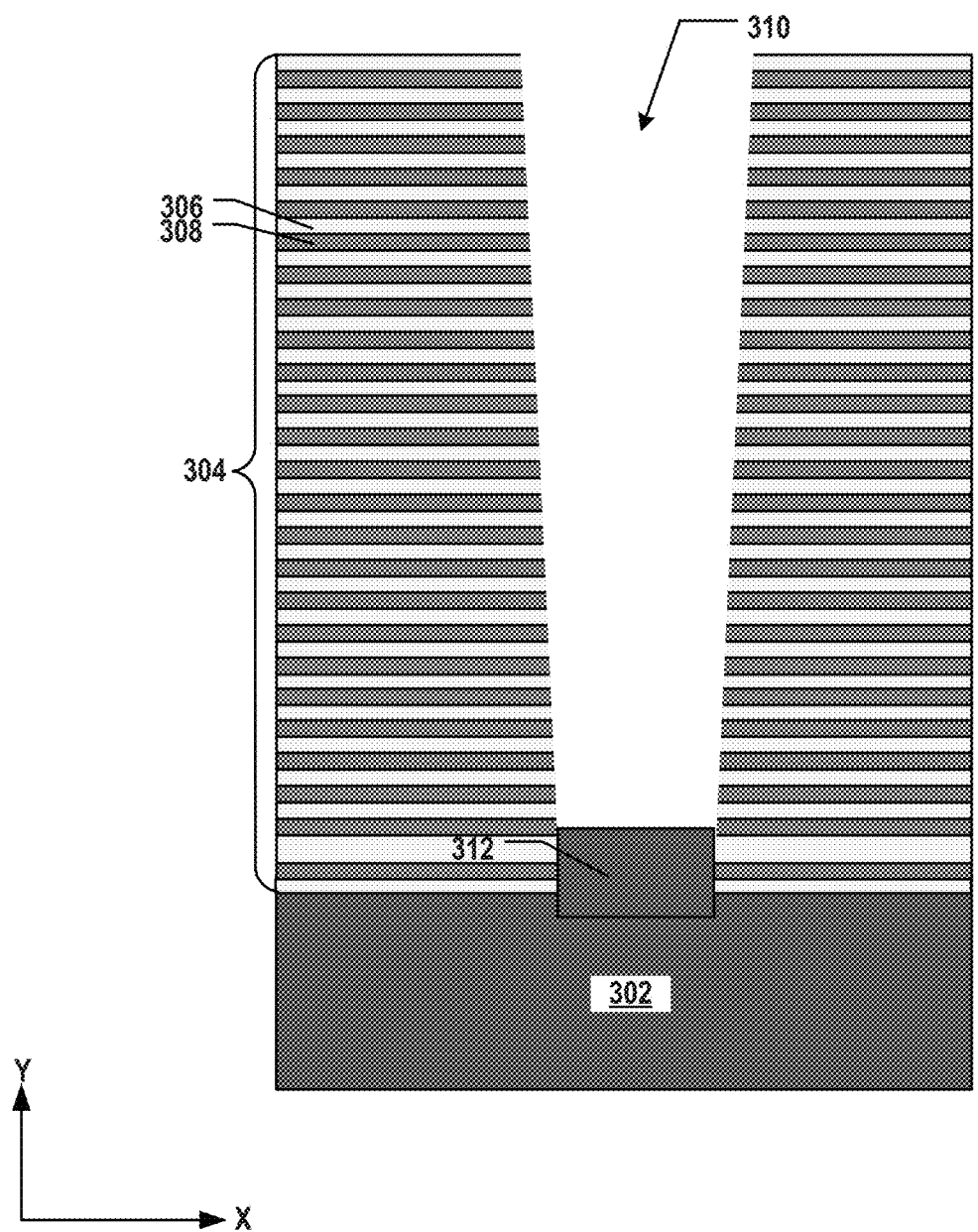
FIGS. 3A-3H illustrate an exemplary fabrication process for forming a 3D memory device having an epitaxially-grown semiconductor channel, according to some embodiments of the present disclosure.
Figure 4:
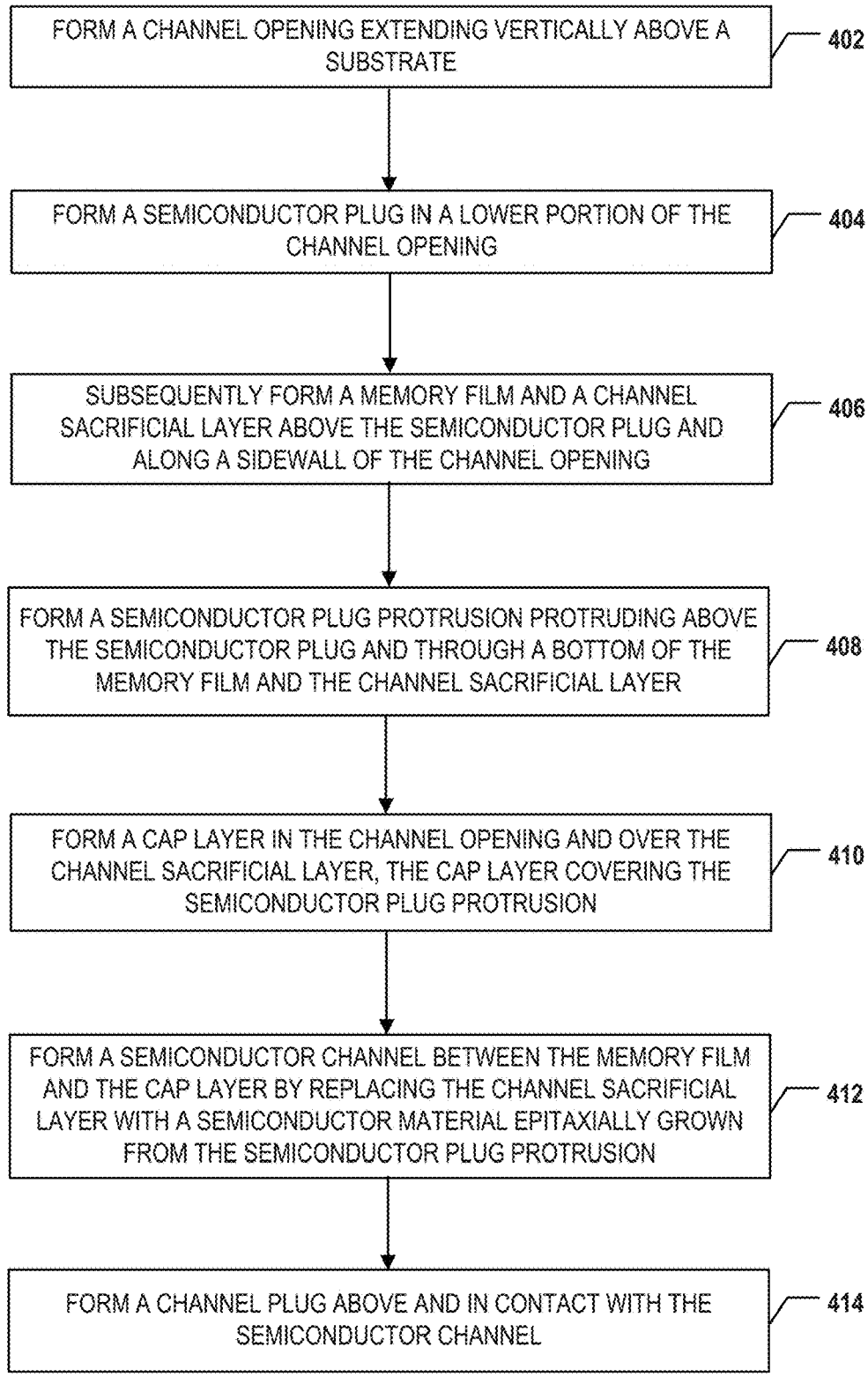
FIG. 4 illustrates a flowchart of an exemplary method for forming a 3D memory device having an epitaxially-grown semiconductor channel, according to some embodiments of the present disclosure.

As illustrated in FIG. 3A, a dielectric stack 304 including a plurality pairs of a first dielectric layer 306 and a second dielectric layer (known as a "sacrificial layer") 308 (together referred to herein as "dielectric layer pairs") is formed above a silicon substrate 302. In some embodiments, a pad layer (not shown) is formed between dielectric stack 304 and silicon substrate 302 by depositing dielectric materials, such as silicon oxide, or thermal oxidation, on silicon substrate 302 prior to the formation of dielectric stack 304. Dielectric stack 304 includes interleaved sacrificial layers 308 and dielectric layers 306, according to some embodiments. Dielectric layers 306 and sacrificial layers 308 can be alternatively deposited above silicon substrate 302 to form dielectric stack 304. In some embodiments, each dielectric layer 306 includes a layer of silicon oxide, and each sacrificial layer 308 includes a layer of silicon nitride. Dielectric stack 304 can be formed by one or more thin film deposition processes including, but not limited to, chemical vapor deposition (CVD), physical vapor deposition (PVD), atomic layer deposition (ALD), or any combination thereof.

As illustrated in FIG. 3A, a channel hole 310 is an opening formed extending vertically through dielectric stack 304. In some embodiments, a plurality of openings are formed through dielectric stack 304 such that each opening becomes the location for growing an individual NAND memory string in the later process. In some embodiments, fabrication processes for forming channel hole 310 include wet etching and/or dry etching, such as deep-ion reactive etching (DRIE). In some embodiments, channel hole 310 extends further through the top portion of silicon substrate 302. The etching process through dielectric stack 304 may not stop at the top surface of silicon substrate 302 and may continue to etch part of silicon substrate 302. In some embodiments, a separate etching process is used to etch part of silicon substrate 302 after etching through dielectric stack 304.

Method 400 proceeds to operation 404, as illustrated in FIG. 4, in which a semiconductor plug is formed in a lower portion of the channel opening. In some embodiments, to form the semiconductor plug, a semiconductor material is epitaxially grown from the substrate. The semiconductor material can be single crystalline silicon.

As illustrated in FIG. 3A, a single crystalline silicon plug 312 can be formed by selectively filling the lower portion of channel hole 310 with single crystalline silicon epitaxially grown from silicon substrate 302 in any suitable directions (e.g., from the bottom surface and/or side surface). The fabrication processes for epitaxially growing single crystalline silicon plug 312 can include, but not limited to, vapor-phase epitaxy (VPE), liquid-phase epitaxy (LPE), molecular-beam epitaxy (MPE), or any combinations thereof. Single crystalline silicon plug 312 can be selectively grown in the lower portion of channel hole 310.

Method 400 proceeds to operation 406, as illustrated in FIG. 4, in which a memory film and a channel sacrificial layer are subsequently formed above the semiconductor plug and along a sidewall of the channel opening. In some embodiments, to subsequently form the memory film and the channel sacrificial layer, a first silicon oxide layer, a silicon nitride layer, a second silicon oxide layer, and a polysilicon layer are subsequently deposited above the semiconductor plug and along the sidewall of the channel opening in this order.

Figure 3B:
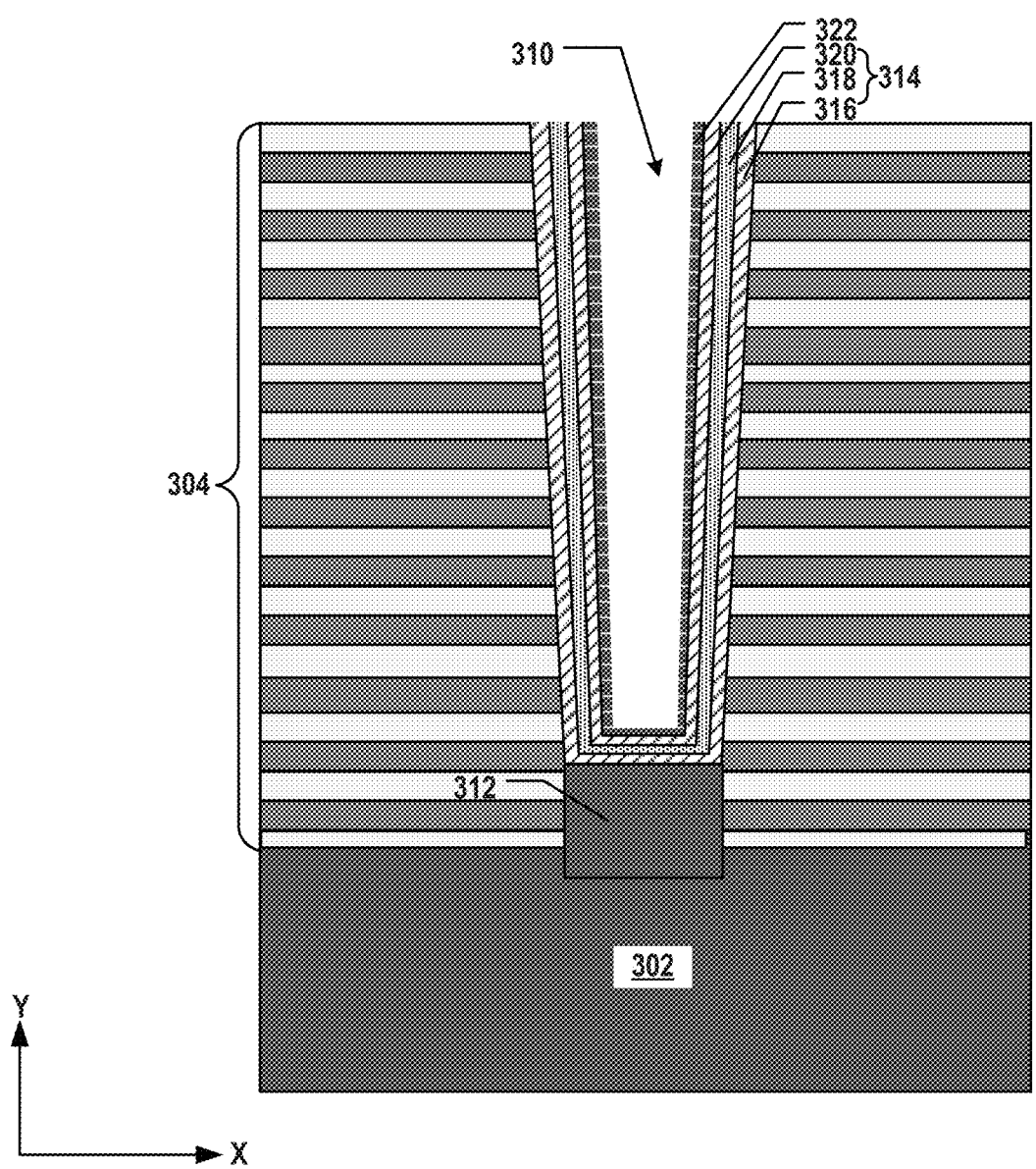

As illustrated in FIG. 3B, a memory film 314 (including a blocking layer 316, a storage layer 318, and a tunneling layer 320) and a channel sacrificial layer 322 are subsequently formed above single crystalline silicon plug 312 and along the sidewall of channel hole 310. In some embodiments, memory film 314 is first deposited along the sidewall of channel hole 310 and over the top surface of single crystalline silicon plug 312, and channel sacrificial layer 322 is then deposited over memory film 314. Blocking layer 316, storage layer 318, and tunneling layer 320 can be subsequently deposited in this order using one or more thin film deposition processes, such as ALD, CVD, PVD, any other suitable processes, or any combination thereof, to form memory film 314. Channel sacrificial layer 322 can then be formed by depositing any suitable sacrificial material that is to be removed in a later process, such as polysilicon, on tunneling layer 320 of memory film 314 using one or more thin film deposition processes, such as ALD, CVD, PVD, any other suitable processes, or any combination thereof. To avoid removing memory film 314 together with channel sacrificial layer 322, channel sacrificial layer 322 and memory film 314 include different materials, according to some embodiments. As shown in FIG. 3B, memory film 314 and channel sacrificial layer 322 can cover both the bottom surface (on single crystalline silicon plug 312) and the sidewall of channel hole 310. In some embodiments, a first silicon oxide layer, a silicon nitride layer, a second silicon oxide layer, and a polysilicon layer (a "SONO" structure) are subsequently deposited to form memory film 314 and channel sacrificial layer 322.

Method 400 proceeds to operation 408, as illustrated in FIG. 4, in which a semiconductor plug protrusion protruding above the semiconductor plug and through a bottom of the memory film and the channel sacrificial layer is formed. In some embodiments, to form the semiconductor plug protrusion, a protrusion opening is etched through the bottom of the memory film and the channel sacrificial layer to reach the semiconductor plug, and a semiconductor material is epitaxially grown from the semiconductor plug through and above the protrusion opening, such that an upper end of the semiconductor plug protrusion comprising the semiconductor material is above the bottom of the channel sacrificial layer. The semiconductor material can include single crystalline silicon.

Figure 3C:
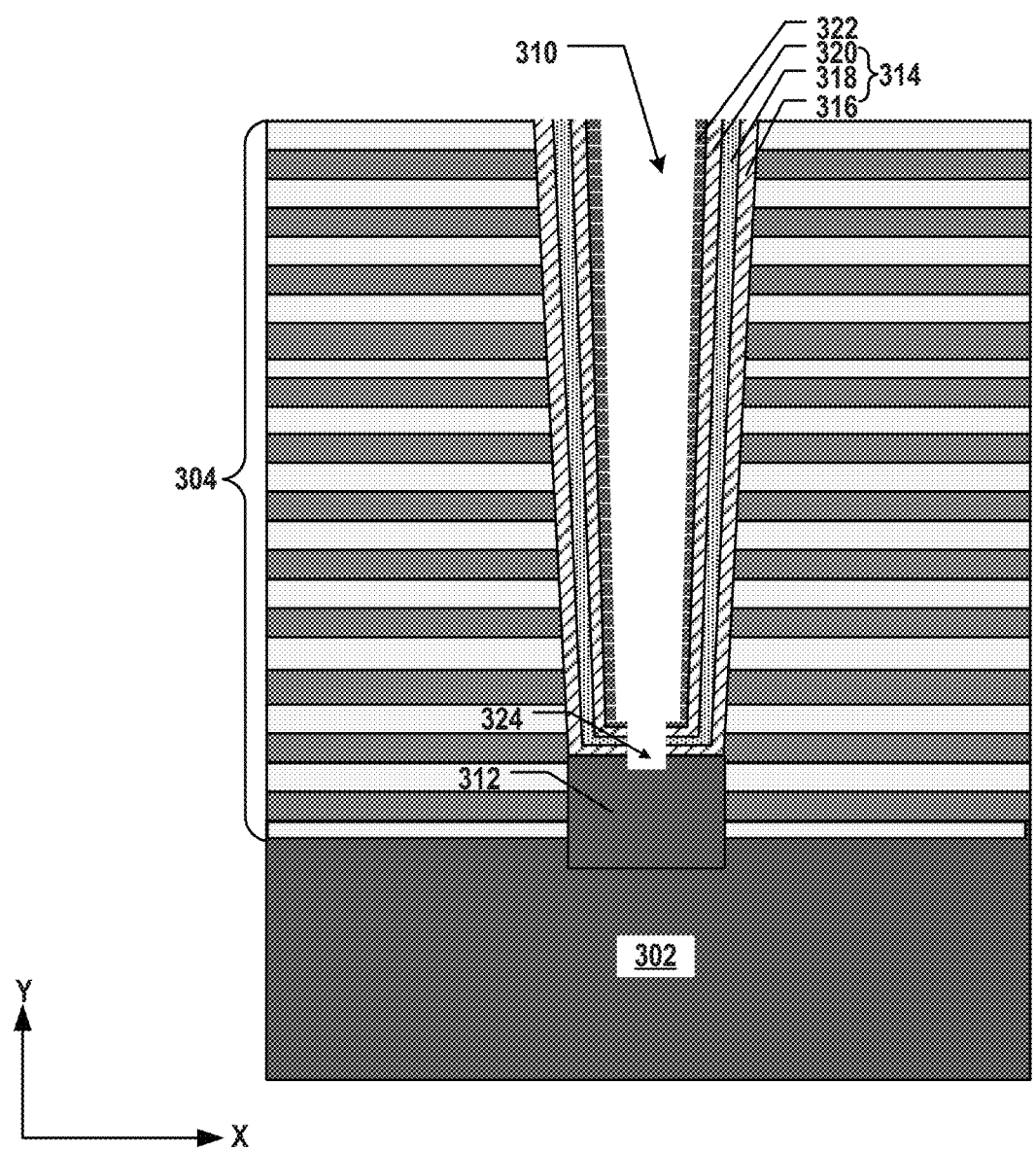

As illustrated in FIG. 3C, a protrusion opening 324 is formed through the bottom of memory film 314 and channel sacrificial layer 322 to reach single crystalline silicon plug 312 using one or more wet etching and/or dry etching processes, such as DRIE. In some embodiments, when a "SONO" structure of channel sacrificial layer 322 and memory film 314 is formed, a process known as "SONO punch" is used to etch through the bottom of channel sacrificial layer 322 and memory film 314 to reach single crystalline silicon plug 312. In some embodiments, protrusion opening 324 extends further into the top portion of single crystalline silicon plug 312. The etching process through memory film 314 may not stop at the top surface of single crystalline silicon plug 312 and may continue to etch part of single crystalline silicon plug 312. In some embodiments, a separate etching process is used to etch part of single crystalline silicon plug 312 after etching through memory film 314.

Figure 3D:
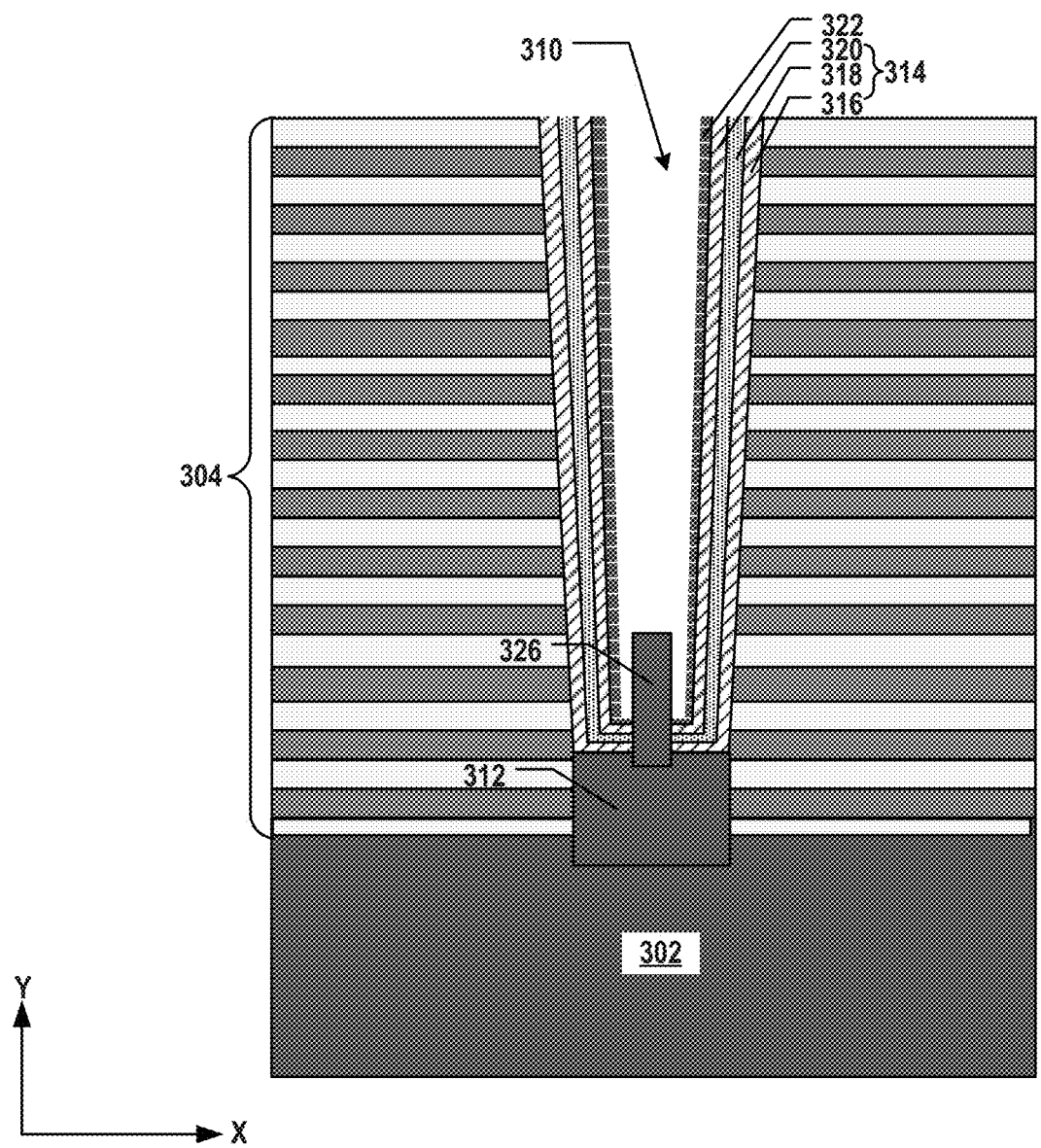

As illustrated in FIG. 3D, a single crystalline silicon plug protrusion 326 can be formed by selectively filling protrusion opening 324 (shown in FIG. 3C) with single crystalline silicon epitaxially grown from single crystalline silicon plug 312 in any suitable directions (e.g., from bottom surface and/or side surface if protrusion opening 324 extends into single crystalline silicon plug 312). In some embodiments, the epitaxial growth of single crystalline silicon continues after filling protrusion opening 324, such that the upper end of single crystalline silicon plug protrusion 326 is above the bottom of channel sacrificial layer 322. That is, single crystalline silicon plug protrusion 326 can protrude further into channel hole 310. The fabrication processes for epitaxially growing single crystalline silicon plug protrusion 326 can include, but not limited to, VPE, LPE, MPE, or any combinations thereof.

Method 400 proceeds to operation 410, as illustrated in FIG. 4, in which a cap layer is formed in the channel opening and over the channel sacrificial layer. The cap layer can cover the semiconductor plug protrusion. In some embodiments, to form the cap layer, a silicon oxide layer is deposited to completely or partially fill the channel opening.

Figure 3E:
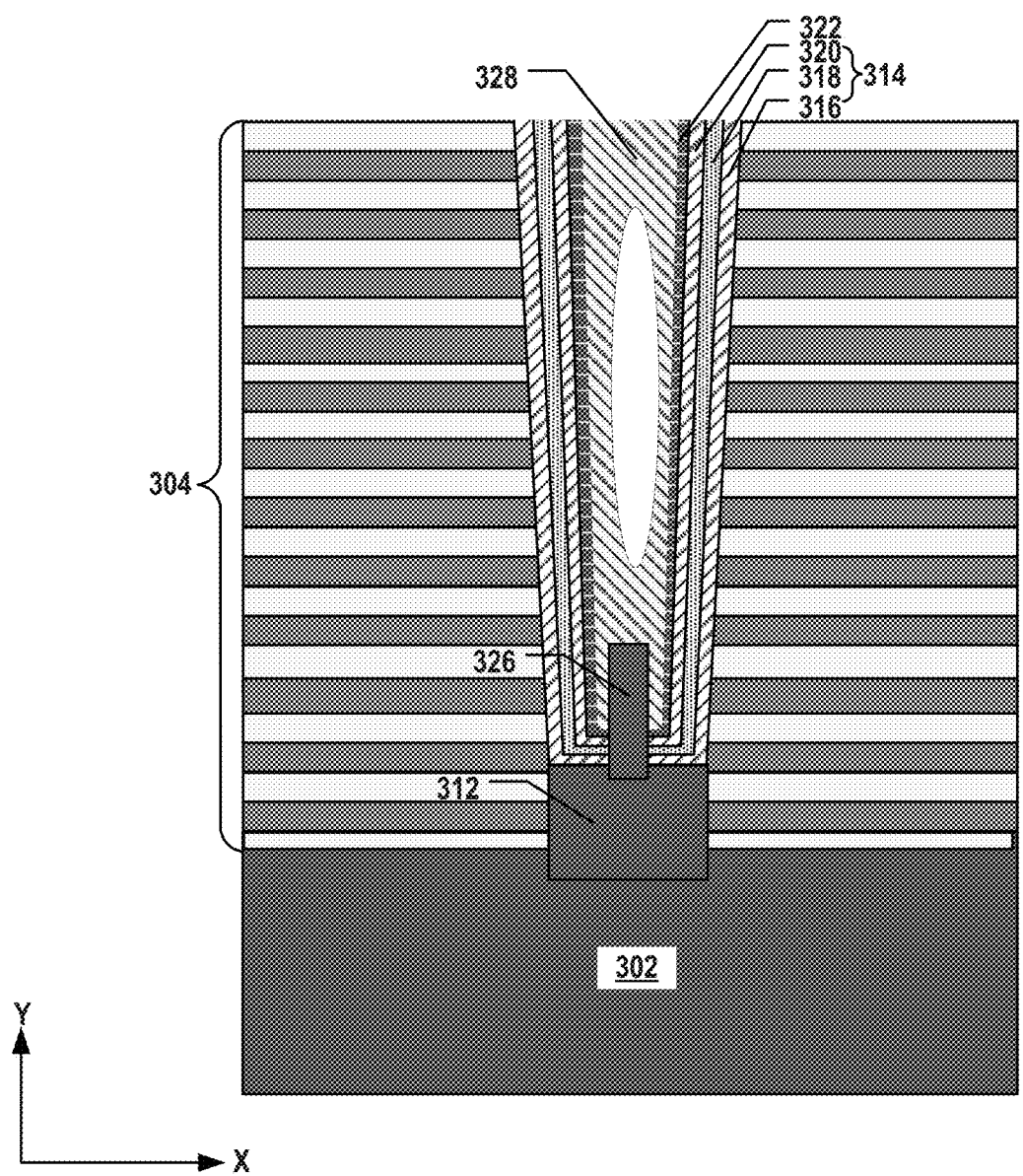

As illustrated in FIG. 3E, a cap layer 328 is formed in channel hole 310 (shown in FIG. 3D) and over channel sacrificial layer 322 to completely or partially fill channel opening 330 (e.g., without or with an air gap). Nevertheless, cap layer 328 covers single crystalline silicon plug protrusion 326. As a result, single crystalline silicon plug protrusion 326 can mechanically connect cap layer 328 to the bottom of memory film 314 and single crystalline silicon plug 312. Cap layer 328 can be formed by depositing a dielectric material, such as silicon oxide, using one or more thin film deposition processes, such as ALD, CVD, PVD, any other suitable processes, or any combination thereof.

Method 400 proceeds to operation 412, as illustrated in FIG. 4, in which a semiconductor channel is formed between the memory film and the cap layer by replacing the channel sacrificial layer with a semiconductor material epitaxially grown from the semiconductor plug protrusion. In some embodiments, to form the semiconductor channel, the channel sacrificial layer is etched away to form a sidewall opening, and the semiconductor material is epitaxially grown from the semiconductor plug protrusion through the sidewall opening to fill the sidewall opening. The semiconductor material can include single crystalline silicon. In some embodiments, the semiconductor plug protrusion supports the sidewall opening prior to the formation of the semiconductor channel.

Figure 3F:
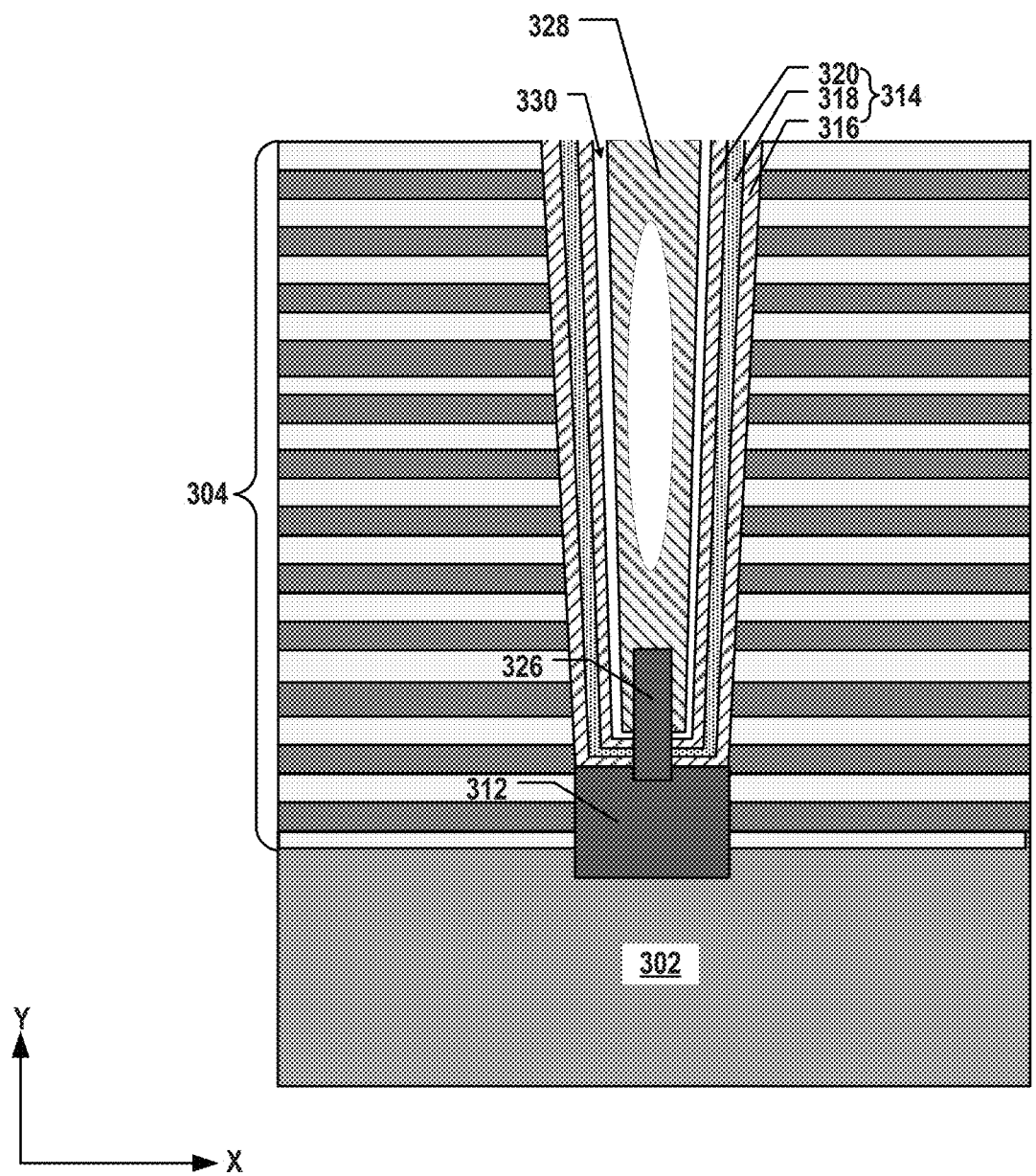

As illustrated in FIG. 3F, channel sacrificial layer 322 (shown in FIG. 3E) can be removed by wet etching and/or dry etching to form a sidewall opening 330 between cap layer 328 and tunneling layer 320 of memory film 314. In some embodiments, since channel sacrificial layer 322 includes polysilicon, while memory film 314 and cap layer 328 include dielectrics, channel sacrificial layer 322 is etched away using tetramethylammonium hydroxide (TMAH) etchant, which can be stopped by the dielectrics of memory film 314 and cap layer 328. Prior to filling sidewall opening 330, single crystalline silicon plug protrusion 326, which mechanically connects cap layer 328 to the bottom of memory film 314 and single crystalline silicon plug 312, can support sidewall opening 330. In other words, collapse of sidewall opening 330 can be prevented by single crystalline silicon plug protrusion 326.

Figure 3G:
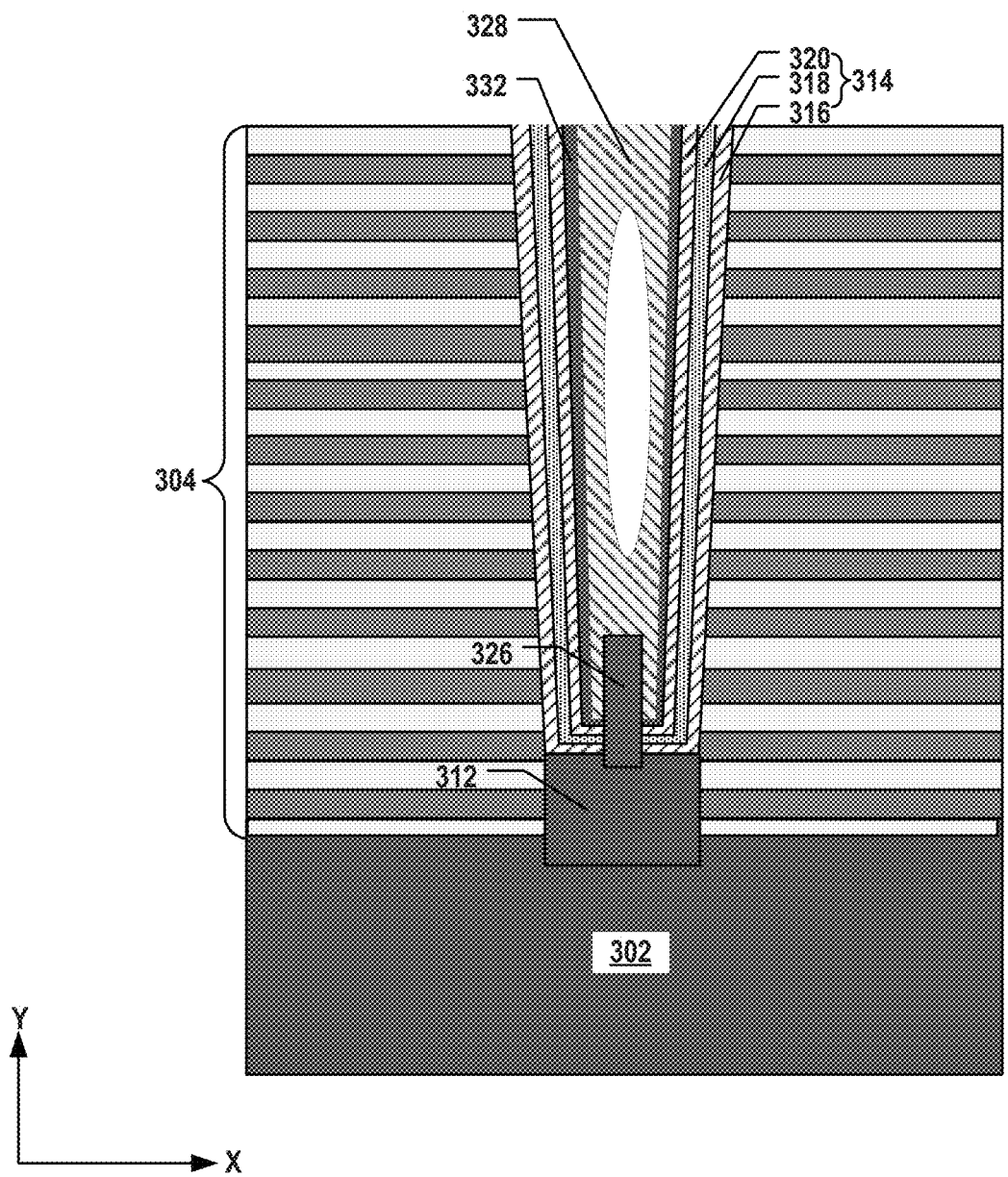

As illustrated in FIG. 3G, a single crystalline silicon channel 332 can be formed by selectively filling sidewall opening 330 (shown in FIG. 3F) with single crystalline silicon epitaxially grown from single crystalline silicon plug protrusion 326 in any suitable directions. The fabrication processes for epitaxially growing single crystalline silicon channel 332 can include, but not limited to, VPE, LPE, MPE, or any combinations thereof. Single crystalline silicon channel 332 can be selectively grown through sidewall opening 330 to fill sidewall opening 330. As a result, single crystalline silicon channel 332 is formed between cap layer 328 and tunneling layer 320 of memory film 314, i.e., replacing channel sacrificial layer 322 (shown in FIG. 3E). Prior to the formation of single crystalline silicon channel 332 (including during the epitaxial growth of single crystalline silicon channel 332), sidewall opening 330 can be supported by single crystalline silicon plug protrusion 326. That is, single crystalline silicon plug protrusion 326 can have a dual role as both the source of the epitaxial growth of single crystalline silicon channel 332 and the mechanical support of sidewall opening 330 before and during the epitaxial growth of single crystalline silicon channel 332.

Figure 3H:
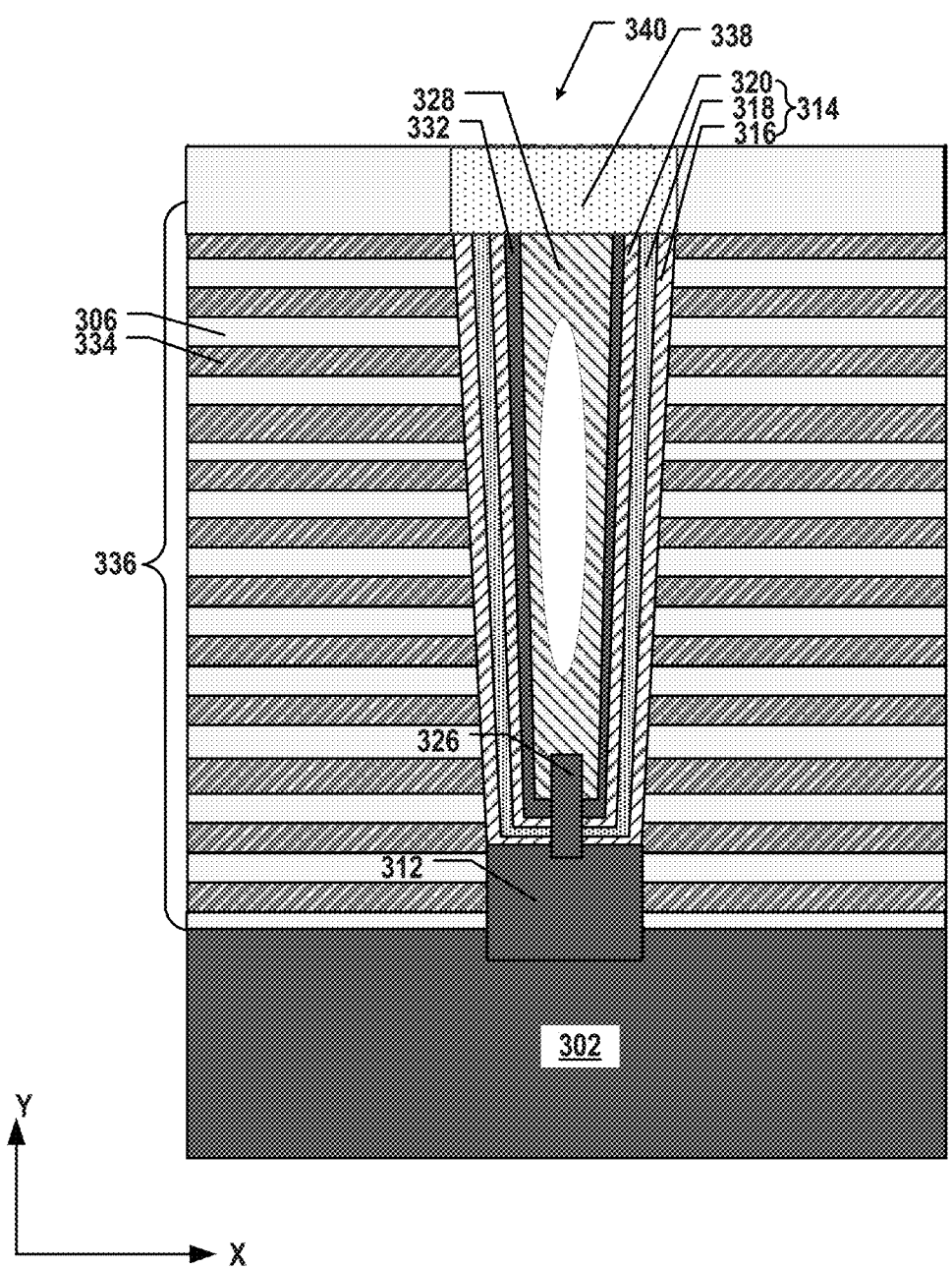

Method 400 proceeds to operation 414, as illustrated in FIG. 4, in which a channel plug is formed above and in contact with the semiconductor channel. As illustrated in FIG. 3H, a channel plug 338 is formed above and in contact with single crystalline silicon channel 332. In some embodiments, parts of single crystalline silicon channel 332 and cap layer 328 (and memory film 314 in some cases) are removed (i.e., etched back) by CMP, wet etching and/or dry etching to form a recess (not shown). Channel plug 338 then can be formed by depositing semiconductor materials, such as polysilicon, into the recess by one or more thin film deposition processes, such as CVD, PVD, ALD, electroplating, electroless plating, or any combination thereof.

As illustrated in FIG. 3H, in some embodiments, after the formation of the channel plug 338, a memory stack 336 can be formed by a gate replacement process, i.e., replacing sacrificial layers 308 (shown in FIG. 3A) with conductive layers 334. Memory stack 336 thus can include interleaved conductive layers 334 and dielectric layers 306 above silicon substrate 302. A NAND memory sting 340 extending vertically through memory stack 336 is thereby formed. In some embodiments, to form memory stack 336, a slit opening (e.g., a gate line slit, not shown) is formed through dielectric stack 304 (shown in FIG. 3G), sacrificial layers 308 in dielectric stack 304 can be etched away by applying etchants through the slit opening to form a plurality of lateral recesses, and conductive layers 334 can be deposited into the lateral recesses.

It is understood that in some embodiments, a memory stack including interleaved conductive layers and dielectric layers may replace dielectric stack 304 in FIG. 3A. That is, instead of forming dielectric stack 304 first and replacing sacrificial layers 308 with conductive layers 334 afterward to form memory stack 336, a memory stack may be formed directly prior to the formation of channel hole 310 without the need of the gate replacement process. Channel hole 310 then can be formed through the memory stack, followed by substantially similar processes described above with respect to FIGS. 3A-3H.

According to one aspect of the present disclosure, a 3D memory device includes a substrate, a memory stack including interleaved conductive layers and dielectric layers above the substrate, and a memory string extending vertically through the memory stack. The memory string includes a single crystalline silicon plug in a lower portion of the memory string, a memory film above the single crystalline silicon plug and along a sidewall of the memory string, and a single crystalline silicon channel over the memory film and along the sidewall of the memory string.

In some embodiments, the single crystalline silicon plug is epitaxially grown from the substrate.

In some embodiments, the memory string further includes a single crystalline silicon plug protrusion protruding above the single crystalline silicon plug and through a bottom of the memory film and the single crystalline silicon channel.

In some embodiments, the single crystalline silicon plug protrusion is epitaxially grown from the single crystalline silicon plug. In some embodiments, the single crystalline silicon channel is epitaxially grown from the single crystalline silicon plug protrusion.

In some embodiments, an upper end of the single crystalline silicon plug protrusion is above the bottom of the single crystalline silicon channel.

In some embodiments, the single crystalline silicon plug protrusion is in contact with the single crystalline silicon channel and the single crystalline silicon plug.

In some embodiments, the memory string further includes a cap layer over the single crystalline silicon channel and covering the single crystalline silicon plug protrusion.

In some embodiments, the memory film includes a blocking layer, a storage layer, and a tunneling layer.

In some embodiments, the memory string further includes a channel plug above and in contact with the single crystalline silicon channel.

According to another aspect of the present disclosure, a 3D memory device includes a substrate, a memory stack including interleaved conductive layers and dielectric layers above the substrate, and a memory string extending vertically through the memory stack. The memory string includes a semiconductor plug in a lower portion of the memory string, a memory film above the semiconductor plug and along a sidewall of the memory string, a semiconductor channel over the memory film and along the sidewall of the memory string, and a semiconductor plug protrusion protruding above the semiconductor plug and through a bottom of the memory film and the semiconductor channel.

In some embodiments, the semiconductor plug, the semiconductor channel, and the semiconductor plug protrusion include a same semiconductor material. In some embodiments, the semiconductor material comprises single crystalline silicon.

In some embodiments, the semiconductor plug is epitaxially grown from the substrate, the semiconductor plug protrusion is epitaxially grown from the semiconductor plug, and the semiconductor channel is epitaxially grown from the semiconductor plug protrusion.

In some embodiments, an upper end of the semiconductor plug protrusion is above the bottom of the semiconductor channel.

In some embodiments, the semiconductor plug protrusion is in contact with the semiconductor channel and the semiconductor plug.

In some embodiments, the memory string further includes a cap layer over the semiconductor channel and covering the semiconductor plug protrusion.

In some embodiments, the memory film includes a blocking layer, a storage layer, and a tunneling layer.

In some embodiments, the memory string further includes a channel plug above and in contact with the single crystalline silicon channel.

According to still another aspect of the present disclosure, a method for forming a 3D memory device is disclosed. A channel opening extending vertically is formed above a substrate. A semiconductor plug is formed in a lower portion of the channel opening. A memory film and a channel sacrificial layer are subsequently formed above the semiconductor plug and along a sidewall of the channel opening. A semiconductor plug protrusion protruding above the semiconductor plug and through a bottom of the memory film and the channel sacrificial layer is formed. A cap layer is formed in the channel opening and over the channel sacrificial layer. The cap layer covers the semiconductor plug protrusion. A semiconductor channel is formed between the memory film and the cap layer by replacing the channel sacrificial layer with a semiconductor material epitaxially grown from the semiconductor plug protrusion.

In some embodiments, to form the semiconductor plug, a semiconductor material is epitaxially grown from the substrate. In some embodiments, the semiconductor material includes single crystalline silicon.

In some embodiments, to subsequently form the memory film and the channel sacrificial layer, a first silicon oxide layer, a silicon nitride layer, a second silicon oxide layer, and a polysilicon layer are subsequently deposited above the semiconductor plug and along the sidewall of the channel opening in this order.

In some embodiments, to form the semiconductor plug protrusion, a protrusion opening is etched through the bottom of the memory film and the channel sacrificial layer to reach the semiconductor plug, and a semiconductor material is epitaxially grown from the semiconductor plug through and above the protrusion opening, such that an upper end of the semiconductor plug protrusion comprising the semiconductor material is above the bottom of the channel sacrificial layer. In some embodiments, the semiconductor material includes single crystalline silicon.

In some embodiments, to form the cap layer, a silicon oxide layer is deposited to completely or partially fill the channel opening.

In some embodiments, to form the semiconductor channel, the channel sacrificial layer is etched away to form a sidewall opening, and the semiconductor material is epitaxially grown from the semiconductor plug protrusion through the sidewall opening to fill the sidewall opening. In some embodiments, the semiconductor plug protrusion supports the sidewall opening prior to the formation of the semiconductor channel. In some embodiments, the semiconductor material includes single crystalline silicon.

In some embodiments, a channel plug is formed above and in contact with the semiconductor channel.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming a channel opening extending vertically above a substrate;
    forming a semiconductor plug in a lower portion of the channel opening;
    subsequently forming a memory film and a channel sacrificial layer above the semiconductor plug and along a sidewall of the channel opening;
    forming a semiconductor plug protrusion protruding above the semiconductor plug and through a bottom of the memory film and the channel sacrificial layer;
    forming a cap layer in the channel opening and over the channel sacrificial layer, the cap layer covering the semiconductor plug protrusion; and
    forming a semiconductor channel between the memory film and the cap layer by replacing the channel sacrificial layer with a semiconductor material epitaxially grown from the semiconductor plug protrusion.

2. The method of claim 1, wherein forming the semiconductor plug comprises epitaxially growing a semiconductor material from the substrate.

3. The method of claim 2, wherein the semiconductor material comprises single crystalline silicon.

4. The method of claim 1, wherein subsequently forming the memory film and the channel sacrificial layer comprises subsequently depositing a first silicon oxide layer, a silicon nitride layer, a second silicon oxide layer, and a polysilicon layer above the semiconductor plug and along the sidewall of the channel opening in this order.

5. The method of claim 1, wherein forming the semiconductor plug protrusion comprises:
    etching a protrusion opening through the bottom of the memory film and the channel sacrificial layer to reach the semiconductor plug; and
    epitaxially growing a semiconductor material from the semiconductor plug through and above the protrusion opening, such that an upper end of the semiconductor plug protrusion comprising the semiconductor material is above the bottom of the channel sacrificial layer.

6. The method of claim 5, wherein the semiconductor material comprises single crystalline silicon.

7. The method of claim 1, wherein forming the cap layer comprises depositing a silicon oxide layer to completely or partially fill the channel opening.

8. The method of claim 1, wherein forming the semiconductor channel comprises:
    etching away the channel sacrificial layer to form a sidewall opening; and
    epitaxially growing the semiconductor material from the semiconductor plug protrusion through the sidewall opening to fill the sidewall opening.

9. The method of claim 8, wherein the semiconductor plug protrusion supports the sidewall opening prior to the formation of the semiconductor channel.

10. The method of claim 8, wherein the semiconductor material comprises single crystalline silicon.

11. The method of claim 1, further comprising forming a channel plug above and in contact with the semiconductor channel.

* * * * *